(12) United States Patent
Sakashita (10) Patent No.: US 10,886,889 B2
(45) Date of Patent: Jan. 5, 2021

(54) ACOUSTIC WAVE DEVICE AND METHOD OF FABRICATING THE SAME, FILTER AND MULTIPLEXER

(71) Applicant: TAIYO YUDEN CO., LTD., Tokyo (JP)

(72) Inventor: Takeshi Sakashita, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 50 days.

(21) Appl. No.: 16/180,500

(22) Filed: Nov. 5, 2018

(65) Prior Publication Data
US 2019/0149123 A1 May 16, 2019

(30) Foreign Application Priority Data
Nov. 13, 2017 (JP) .................. 2017-218263

(51) Int. Cl.
| | | |
|---|---|---|
| H03H 9/02 | (2006.01) | |
| H03H 9/145 | (2006.01) | |
| H03H 9/72 | (2006.01) | |
| H03H 9/64 | (2006.01) | |
| H03H 9/13 | (2006.01) | |
| H03H 3/08 | (2006.01) | |
| H03H 3/02 | (2006.01) | |
| H03H 9/17 | (2006.01) | |

(52) U.S. Cl.
CPC .......... *H03H 9/02574* (2013.01); *H03H 3/02* (2013.01); *H03H 3/08* (2013.01); *H03H 9/02047* (2013.01); *H03H 9/02102* (2013.01); *H03H 9/02629* (2013.01); *H03H 9/02834* (2013.01); *H03H 9/02992* (2013.01); *H03H 9/13* (2013.01); *H03H 9/131* (2013.01); *H03H 9/14502* (2013.01); *H03H 9/173* (2013.01); *H03H 9/6433* (2013.01); *H03H 9/725* (2013.01); *H03H 2003/021* (2013.01)

(58) Field of Classification Search
CPC ........... H03H 9/02574; H03H 9/02992; H03H 9/02047; H03H 9/02834; H03H 9/173; H03H 9/02102; H03H 9/13; H03H 9/02629; H03H 3/02; H03H 3/08; H03H 9/131; H03H 9/6433; H03H 9/725; H03H 9/14502; H03H 2003/021
USPC .......................... 333/133, 187, 188, 193–196
See application file for complete search history.

(56) References Cited

U.S. PATENT DOCUMENTS

| | | | | |
|---|---|---|---|---|
| 8,692,630 B2* | 4/2014 | Reinhardt | ................ | H03H 3/04 333/133 |
| 2003/0034859 A1* | 2/2003 | Kadota | .............. | H03H 9/02669 333/193 |

(Continued)

FOREIGN PATENT DOCUMENTS

| | | |
|---|---|---|
| JP | H05-275963 A | 10/1993 |
| JP | 2002-261571 A | 9/2002 |

(Continued)

*Primary Examiner* — Robert J Pascal
*Assistant Examiner* — Jorge L Salazar, Jr.
(74) *Attorney, Agent, or Firm* — Chen Yoshimura LLP (57) ABSTRACT

An acoustic wave device includes: a first substrate having a first surface and a side surface; an acoustic wave resonator located on the first surface of the first substrate; and a first insulator film that covers the acoustic wave resonator and is in contact with at least a part, which is located closer to the first surface, of the side surface of the first substrate.

19 Claims, 11 Drawing Sheets

(56) References Cited

U.S. PATENT DOCUMENTS

| | | |
|---|---|---|
| 2005/0071971 A1 | 4/2005 | Yamato |
| 2016/0380611 A1 | 12/2016 | Kai |
| 2016/0380616 A1* | 12/2016 | Takamine .......... H03H 9/02574 333/133 |

FOREIGN PATENT DOCUMENTS

| | | |
|---|---|---|
| JP | 2005-117151 A | 4/2005 |
| JP | 2005-142629 A | 6/2005 |
| JP | 2017-11681 A | 1/2017 |

* cited by examiner

ACOUSTIC WAVE DEVICE AND METHOD OF FABRICATING THE SAME, FILTER AND MULTIPLEXER

CROSS-REFERENCE TO RELATED APPLICATION

This application is based upon and claims the benefit of priority of the prior Japanese Patent Application No. 2017-218263, filed on Nov. 13, 2017, the entire contents of which are incorporated herein by reference.

FIELD

A certain aspect of the present invention relates to an acoustic wave device and a method of fabricating the same, a filter, and a multiplexer.

BACKGROUND

In recent years, acoustic wave devices having acoustic wave resonators have been used for filters of mobile communication devices typified by smartphones and mobile phones. It has been known to provide an insulator film so that the insulator film covers the acoustic wave resonator as disclosed in, for example, Japanese Patent Application Publication Nos. H05-275963, 2005-142629, and 2017-11681.

SUMMARY OF THE INVENTION

According to a first aspect of the present invention, there is provided an acoustic wave device including: a first substrate having a first surface and a side surface; an acoustic wave resonator located on the first surface of the first substrate; and a first insulator film that covers the acoustic wave resonator and is in contact with at least a part, which is located closer to the first surface, of the side surface of the first substrate.

According to a second aspect of the present invention, there is provided a filter including the above acoustic wave device.

According to a third aspect of the present invention, there is provided a multiplexer including the above filter.

According to a fourth aspect of the present invention, there is provided a method of fabricating an acoustic wave device, the method including: forming an acoustic wave resonator on a first surface of a substrate; forming a groove on the first surface of the substrate so that the groove surrounds the acoustic wave resonator; forming an insulator film so that the insulator film covers the acoustic wave resonator and is in contact with a side surface of the groove; and cutting the substrate at a bottom of the groove.

DETAILED DESCRIPTION

When the insulator film covers the acoustic wave resonator, the characteristics of the acoustic wave resonator is inhibited from varying due to water in the air. However, in the periphery of the substrate, water may penetrate into the acoustic wave resonator from the boundary face between the substrate and the insulator film.

The following will describe embodiments of the present disclosure with reference to the drawings.

First Embodiment

Figure 1A:
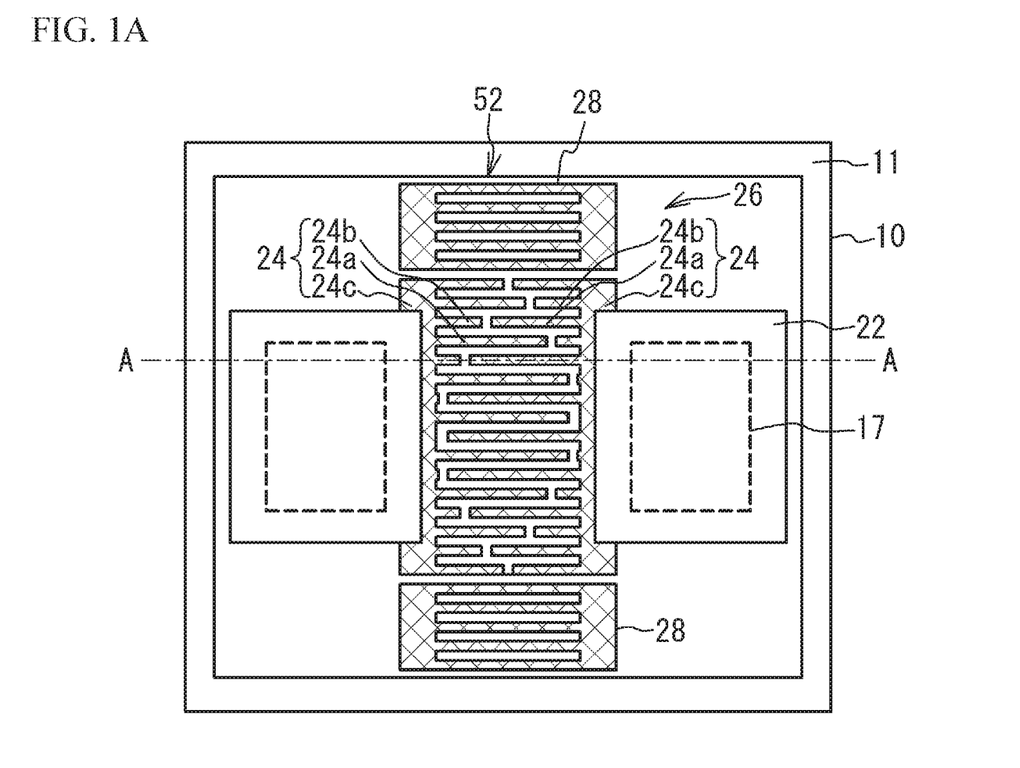
FIG. 1A is a plan view of an acoustic wave device in accordance with a first embodiment.
Figure 1B:
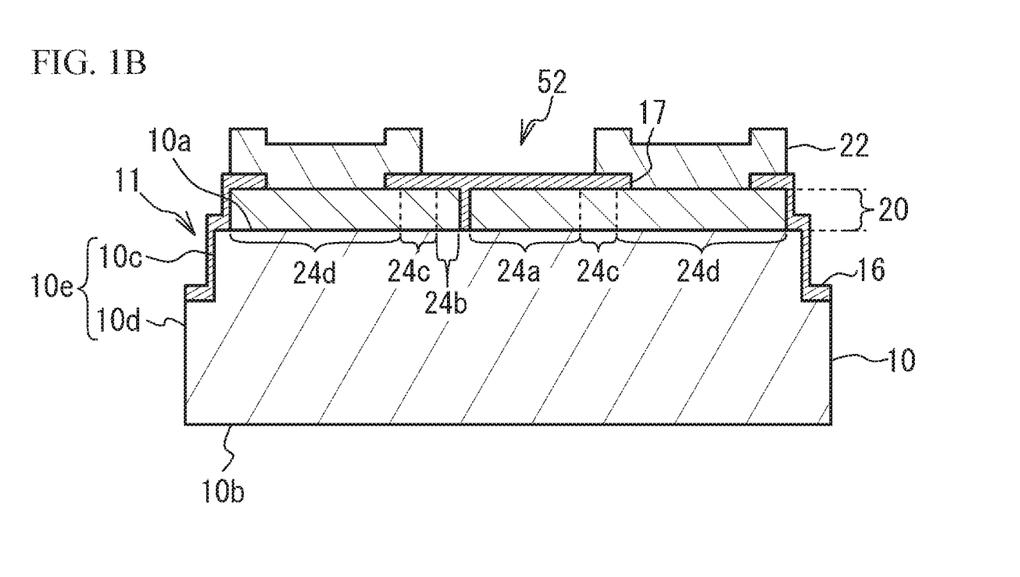
FIG. 1B is a cross-sectional view taken along line A-A in FIG. 1A.

FIG. 1A is a plan view of an acoustic wave device in accordance with a first embodiment, and FIG. 1B is a cross-sectional view taken along line A-A in FIG. 1A. As illustrated in FIG. 1A and FIG. 1B, a substrate 10 is a piezoelectric substrate such as, for example, a lithium tantalate (LiTaO$_3$) substrate, a lithium niobate (LiNbO$_3$) substrate, or a crystal substrate. The substrate 10 has an upper surface 10a (a first surface), a lower surface 10b (a second surface) that is an opposite surface from the upper surface 10a, and a side surface 10e. The substrate 10 has a thickness of, for example, 100 μm to 250 μm. A groove 11 is formed in the periphery of the upper surface 10a of the substrate 10. The groove 11 has a depth of, for example, 10 μm to 100 μm. The side surface 10e has a side surface 10c closer to the upper surface 10a (the side surface of the groove 11) and a side surface 10d closer to the lower surface 10b. At the bottom of the groove 11, a level difference is formed between the side surfaces 10c and 10d. Accordingly, the side surface 10d is located further out than the side surface 10c. The distance between the side surfaces 10c and 10d is, for example, from 10 μm to 30 μm.

A surface acoustic wave resonator 52 is located on the upper surface 10a of the substrate 10. The surface acoustic wave resonator 52 includes an Interdigital Transducer (IDT) 26 and reflectors 28. The reflectors 28 are located at both sides of the IDT 26 in the propagation direction of the acoustic wave. The IDT 26 includes a pair of comb-shaped electrodes 24. Each of the comb-shaped electrodes 24 includes electrode fingers 24a, dummy electrode fingers 24b, and a bus bar 24c. The electrode fingers 24a and the dummy electrode fingers 24b are coupled to the bus bar 24c. The electrode fingers 24a of one of the pair of comb-shaped electrodes 24 face the dummy electrode fingers 24b of the other of the pair of comb-shaped electrodes 24 in the extension direction of the electrode finger 24a. Wiring lines 24d are coupled to the bus bars 24c of the IDT26. Pads 22 are located on the wiring lines 24d. FIG. 1A illustrates an apodization surface acoustic wave resonator, but the surface acoustic wave resonator may be a normal surface acoustic wave resonator. In the case of the normal surface acoustic wave resonator, no dummy electrode finger may be provided.

The IDT26, the reflectors 28, and the wiring lines 24d are formed of a metal film 20 located on the upper surface 10a of the substrate 10. The metal film 20 is, for example, a single-layer metal film mainly composed of at least one of aluminum (Al), copper (Cu), titanium (Ti), chrome (Cr), ruthenium (Ru), tungsten (W), molybdenum (Mo), platinum (Pt), and gold (Au), or a multilayered metal film of at least two of them. The metal film 20 is, for example, a Ti film and an Al film stacked in this order from the substrate 10 side, or a Ru film and a Cu film stacked in this order from the substrate 10 side. The metal film 20 has a film thickness of, for example, 300 nm.

An insulator film 16 is located on the substrate 10 so as to cover the surface acoustic wave resonator 52. The insulator film 16 is in contact with the substrate 10 in the periphery of the upper surface 10a, the side surface 10c, and the bottom of the groove 11, and no insulator film 16 is located on the side surface 10d. The insulator film 16 is a film having high moisture resistance, and is, for example, an inorganic insulator film (for example, a metal oxide film or a metal nitride film) mainly composed of silicon nitride ($SiN_x$), silicon oxide ($SiO_2$), silicon oxynitride ($SiO_xN_y$), aluminum oxide ($Al_2O_3$), or diamond-like carbon. The insulator film 16 has a film thickness of, for example, 10 nm to 100 nm, and has a film thickness of, for example, 50 nm.

An aperture 17 is located in the insulator film 16 on the wiring line 24d. The pad 22 is located on the metal film 20 so as to be in contact with the wiring line 24d through the aperture 17. The pad 22 is formed of a metal film, and is formed of, for example, a Ti film and an Au film stacked in this order from the metal film 20 side.

Fabrication Method of the First Embodiment

Figure 2A:
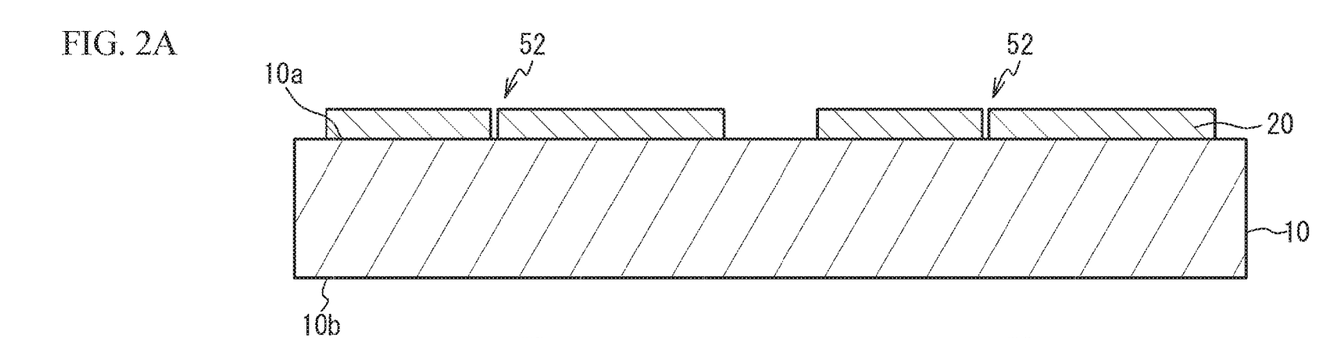
FIG. 2A through FIG. 2C are cross-sectional views (No. 1) illustrating a method of fabricating the acoustic wave device of the first embodiment.

FIG. 2A through FIG. 3C are cross-sectional views illustrating a method of fabricating the acoustic wave device of the first embodiment. As illustrated in FIG. 2A, the substrate 10 has the flat upper surface 10a and the flat lower surface 10b. The metal film 20 is formed on the upper surface 10a of the substrate 10. The metal film 20 is formed by, for example, vacuum evaporation, or sputtering and liftoff. Instead of liftoff, the metal film 20 may be patterned into a desired shape by etching such as dry etching. This process forms the surface acoustic wave resonators 52 from the metal film 20.

A dielectric film (not illustrated) may be provided so as to cover the metal film 20. The dielectric film is, for example, a frequency adjusting film for adjusting the resonant frequency, and is, for example, a silicon oxide film or a silicon nitride film. The dielectric film is formed by, for example, sputtering or Chemical Vapor Deposition (CVD), and is patterned into a desired shape by etching such as dry etching.

Figure 2B:
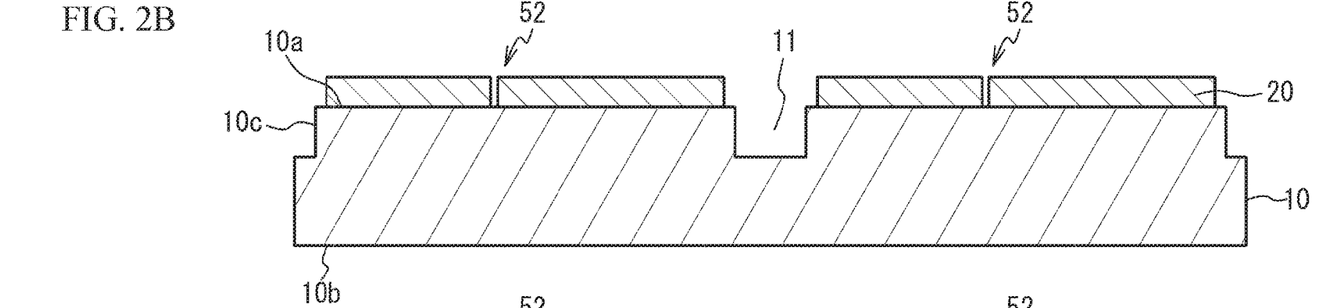

As illustrated in FIG. 2B, the groove 11 is formed on the upper surface 10a of the substrate 10 so as to surround the surface acoustic wave resonators 52. The groove 11 is formed by, for example, half dicing using a dicing blade. The groove 11 may be formed by etching or blasting.

Figure 2C:
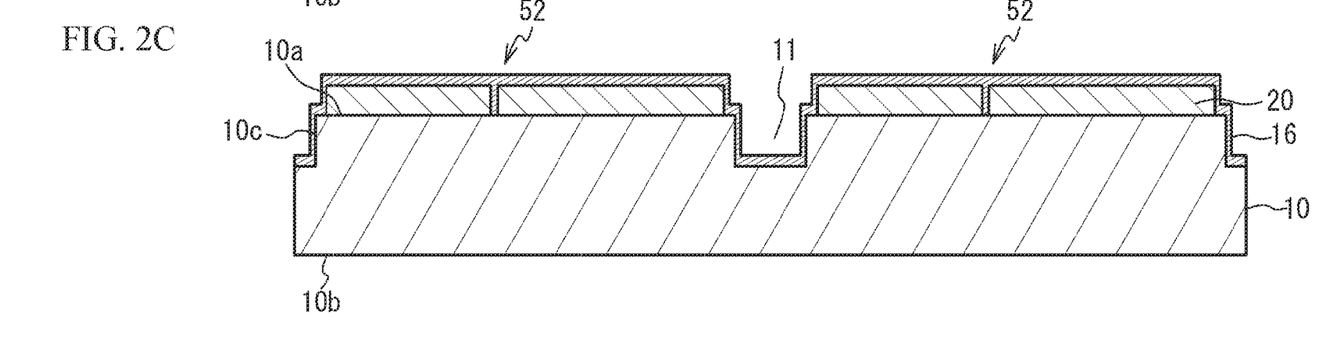

As illustrated in FIG. 2C, the insulator film 16 is formed on the substrate 10 so as to cover the surface acoustic wave resonators 52. The insulator film 16 is formed so as to be in contact with the side surface 10c and the bottom of the groove 11 and the upper surface 10a of the substrate 10 near the groove 11. The insulator film 16 is formed by, for example, sputtering, CVD, or Atomic Layer Deposition (ALD).

Figure 3A:
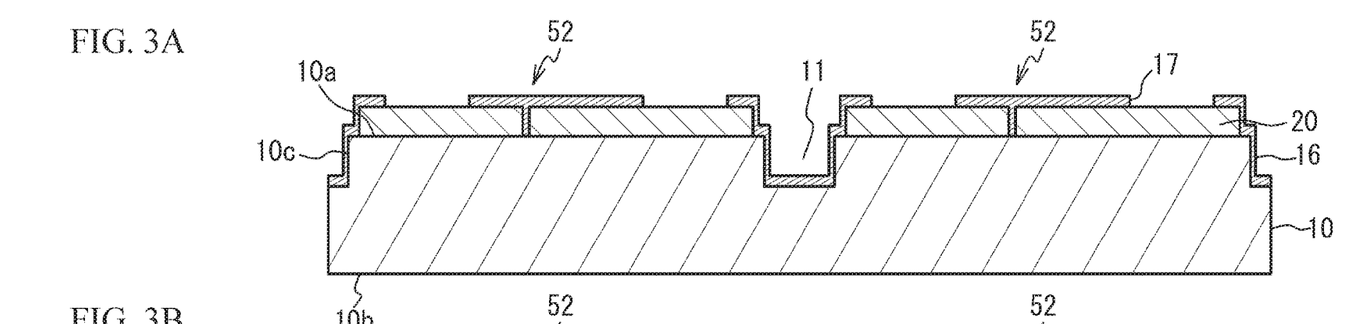
FIG. 3A through FIG. 3C are cross-sectional views (No. 2) illustrating the method of fabricating the acoustic wave device of the first embodiment.

As illustrated in FIG. 3A, the apertures 17 of the insulator film 16 are formed on the metal film 20. The apertures 17 are formed by, for example, dry etching or wet etching.

Figures 3B, 3C:
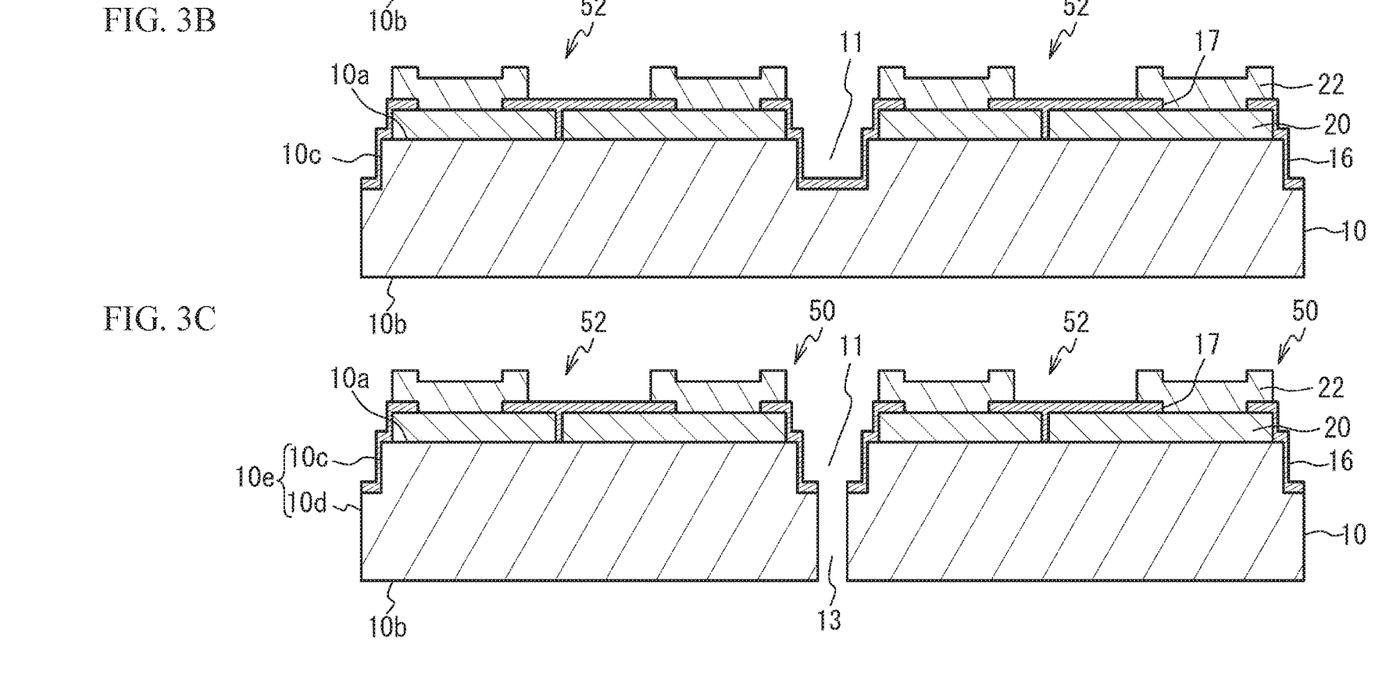

As illustrated in FIG. 3B, the pads 22 are formed on the apertures 17. The pads 22 are formed by, for example, vacuum evaporation, or sputtering and liftoff.

As illustrated in FIG. 3C, a groove 13 penetrating through the substrate 10 is formed in the groove 11. The groove 13 is formed by, for example, full dicing using a dicing blade. This process separates the substrate 10 into a plurality of chips 50. The substrate 10 may be separated by cleaving or the like.

Figure 4:
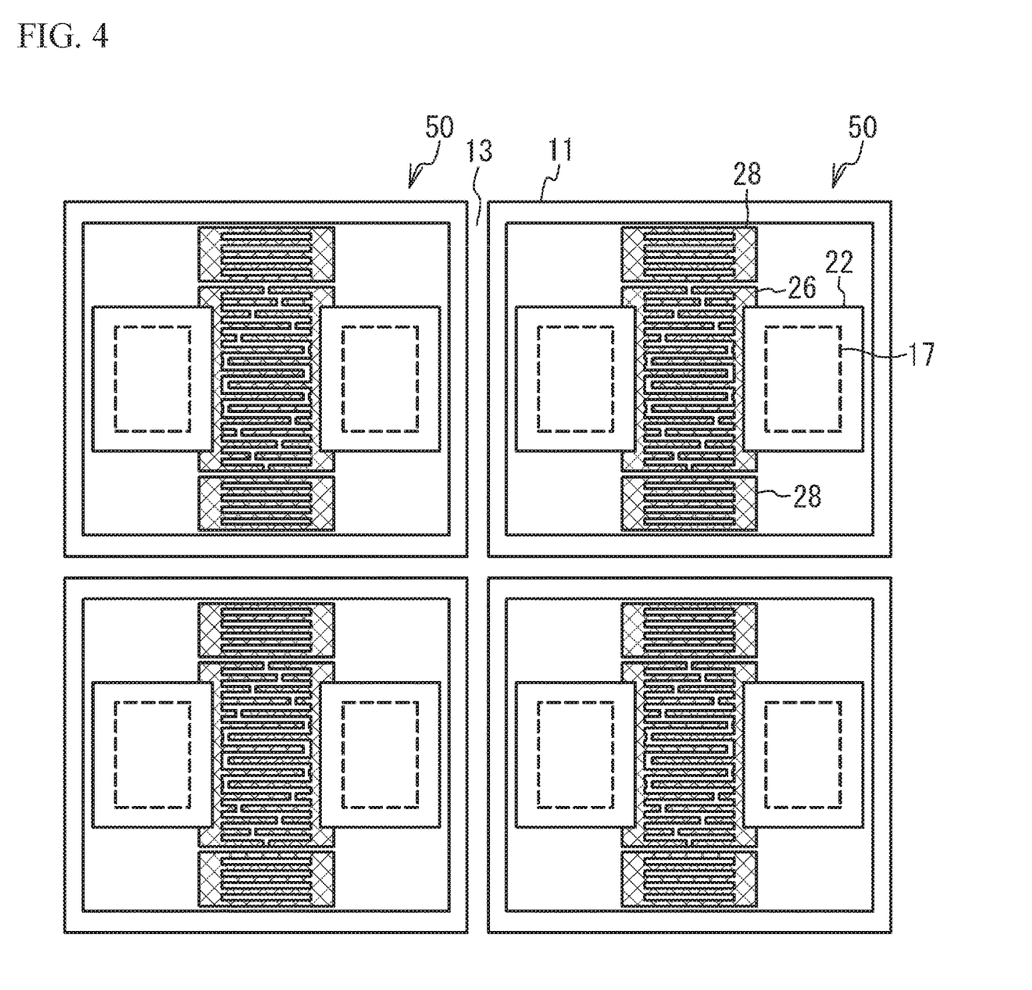
FIG. 4 is a plan view illustrating the method of fabricating the acoustic wave device of the first embodiment.

FIG. 4 is a plan view illustrating the method of fabricating the acoustic wave device of the first embodiment. As illustrated in FIG. 4, the substrate 10 is separated into multiple chips 50 by forming the grooves 13. The chips 50 are arranged in a wafer in a matrix form.

First Comparative Example

Figure 5A:
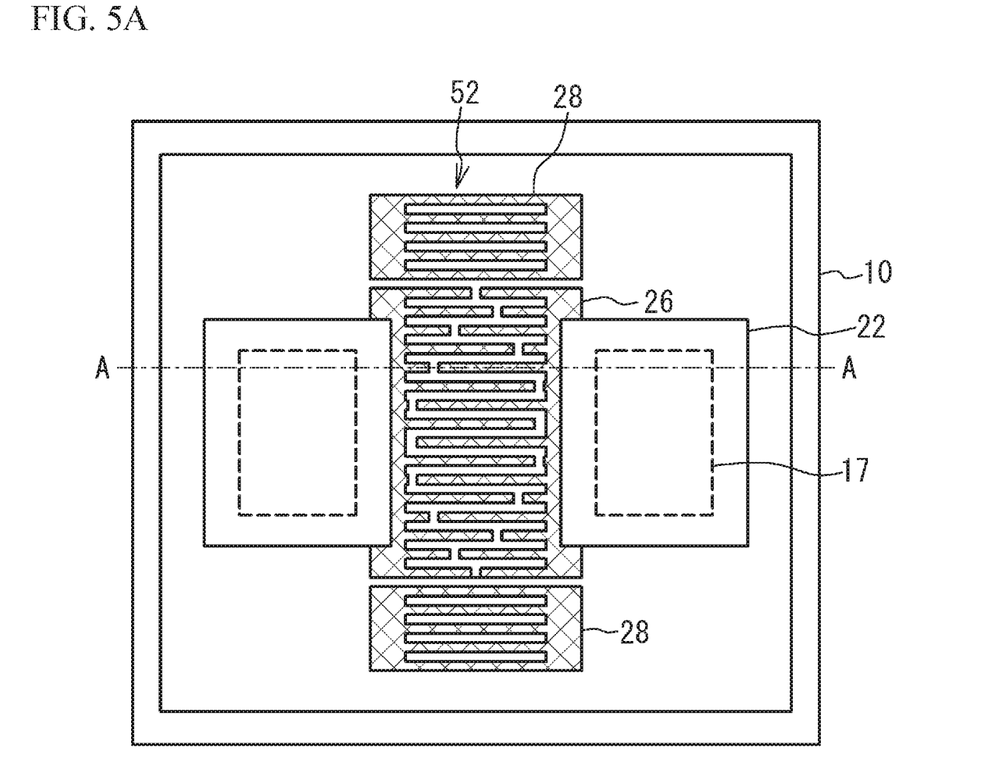
FIG. 5A is a plan view of an acoustic wave device in accordance with a first comparative example.
Figure 5B:
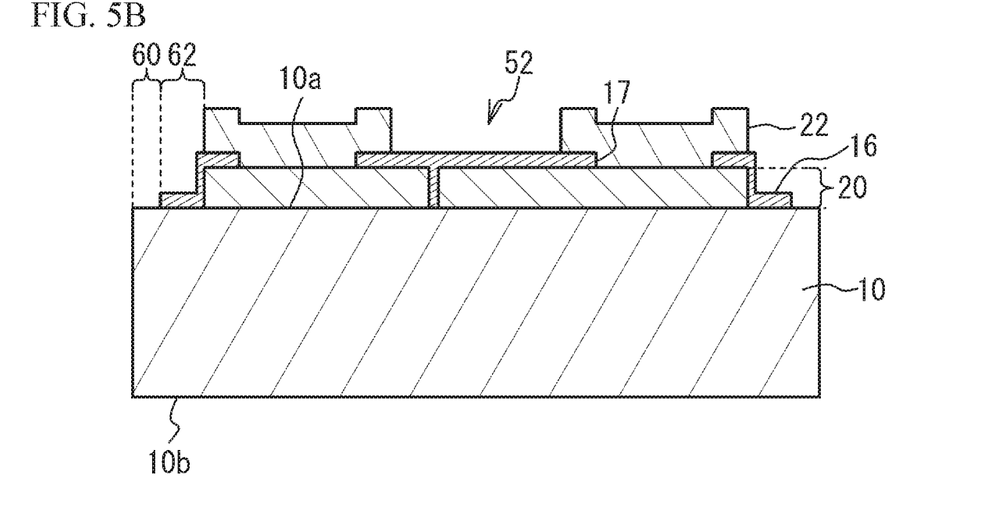
FIG. 5B is a cross-sectional view taken along line A-A in FIG. 5A.

FIG. 5A is a plan view of an acoustic wave device in accordance with a first comparative example, and FIG. 5B is a cross-sectional view taken along line A-A in FIG. 5A. As illustrated in FIG. 5A and FIG. 5B, in the first comparative example, the groove 11 is not formed on the upper surface 10a of the substrate 10, and the upper surface 10a is substantially flat. No insulator film 16 is located in a region 60 of the periphery of the substrate 10, and the insulator film 16 is in contact with the substrate 10 in a region 62 located further in than the region 60.

Second Comparative Example

Figure 6:
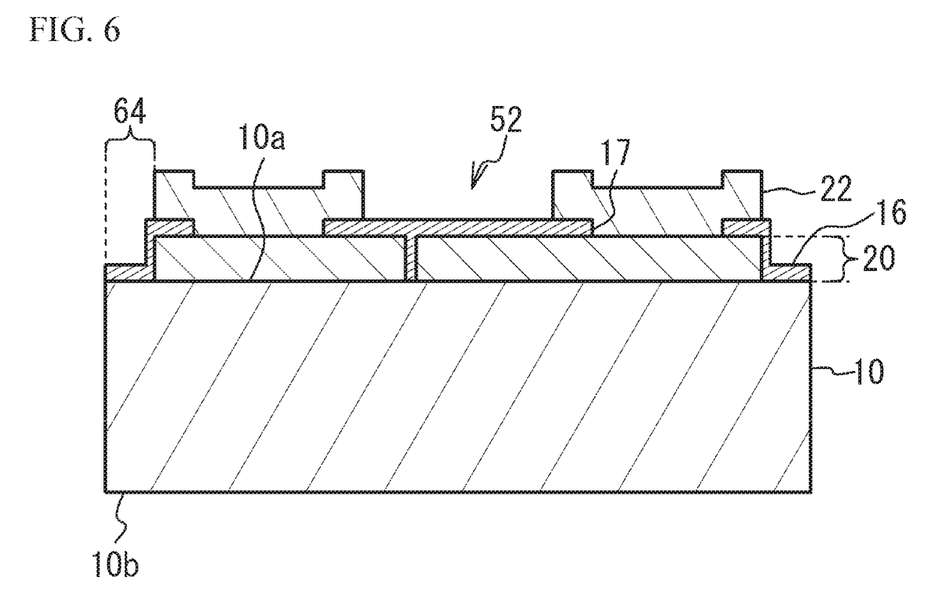
FIG. 6 is a cross-sectional view of an acoustic wave device in accordance with a second comparative example.

FIG. 6 is a cross-sectional view of an acoustic wave device in accordance with a second comparative example. As illustrated in FIG. 6, in the second comparative example, the insulator film 16 is in contact with the substrate 10 in a region 64 of the periphery of the substrate 10. In the second comparative example, when the substrate 10 is cut, a crack and/or peeling occurs in the insulator film 16. Thus, water penetrates into the surface acoustic wave resonator 52 from the boundary face between the insulator film 16 and the substrate 10.

Thus, in the first comparative example, as illustrated in FIG. 5B, no insulator film 16 is located in the region 60 of the periphery of the substrate 10. This structure inhibits a crack and/or peeling from occurring in the insulator film 16 when the substrate 10 is cut. However, the region 60 needs to be provided. Furthermore, the region 62 needs to be provided to reduce the penetration of water from the boundary face between the insulator film 16 and the substrate 10. This leads to increase in chip size.

Comparison Between the First Comparative Example and the First Embodiment

Figure 7A:
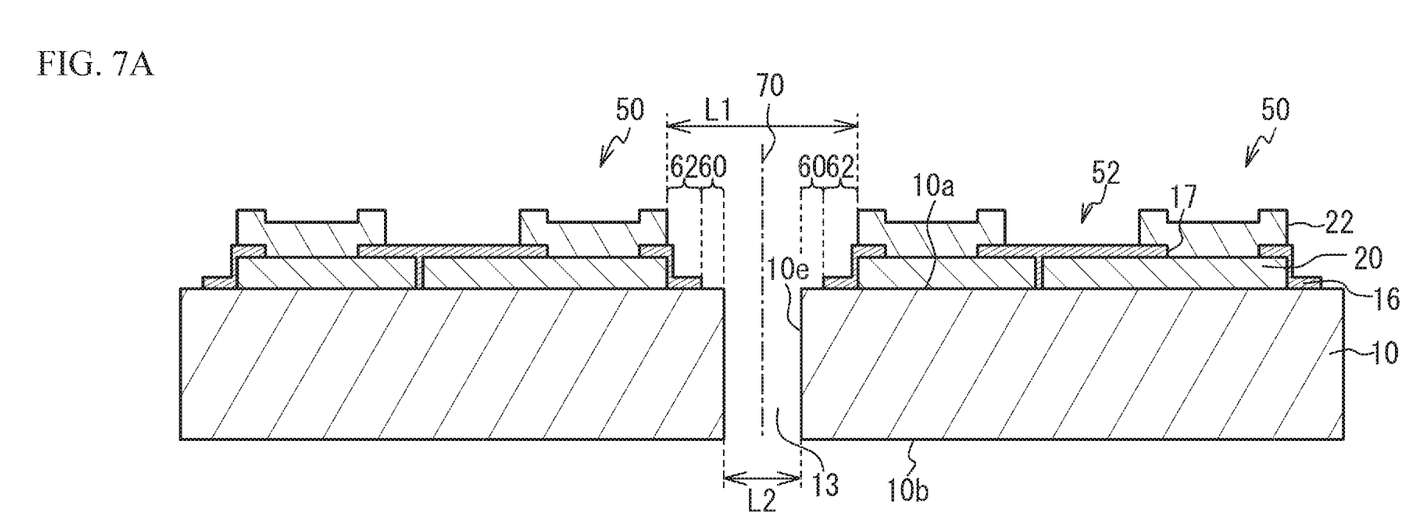
FIG. 7A and FIG. 7B are cross-sectional views illustrating fabrication methods of the first comparative example and the first embodiment, respectively.
Figure 7B:
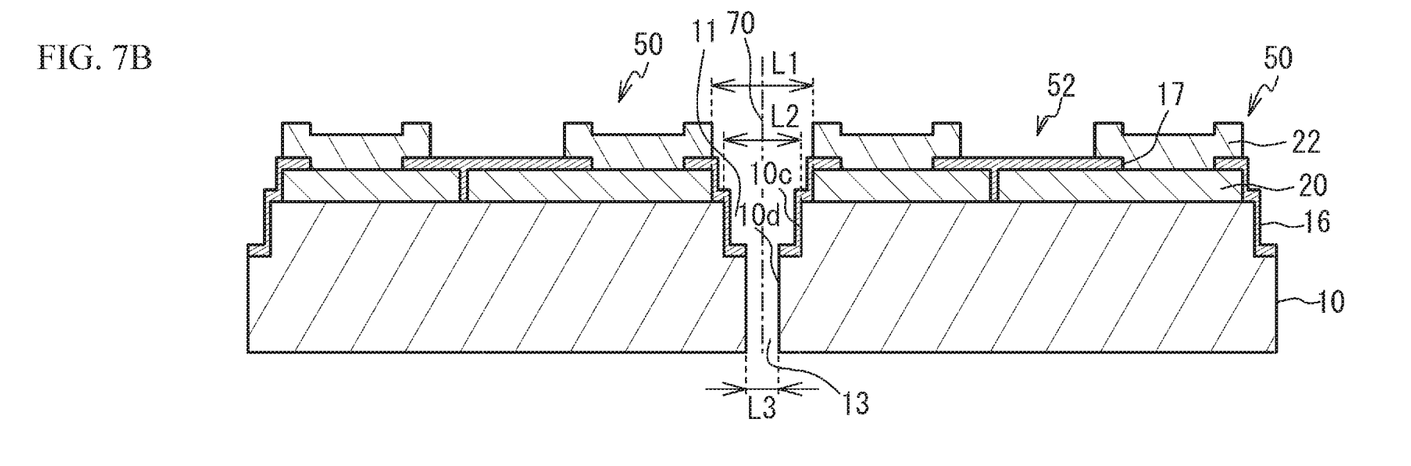

The dimensions of the first comparative example and the first embodiment are compared. FIG. 7A and FIG. 7B are cross-sectional views illustrating the fabrication methods of the first comparative example and the first embodiment, respectively. A chain line 70 indicates a center line of the groove 13 for cutting the substrate 10. As illustrated in FIG. 7A, in the first comparative example, when the substrate 10 is cut by full dicing, the width L2 of the groove 13 for dicing is, for example, 75 μm. The distance L1 between the pads 22 of the adjacent chips 50 for providing the regions 60 and 62 is, for example, 150 μm.

As illustrated in FIG. 7B, in the first embodiment, the groove 13 for cutting the substrate 10 is provided in the groove 11. Thus, the thickness of the substrate 10 to be cut is thinner than that in FIG. 7A. Thus, the width L3 of the groove 13 for dicing can be less than the width L2 in FIG. 7A. The width L3 is, for example, 50 μm. The width L2 of the groove 11 is greater than the width L3, and is, for example, 75 μm. Even when a crack and/or peeling occurs in the insulator film 16 at the time of forming the groove 13, a crack and/or peeling does not reach the outside of the bottom of the groove 11. Thus, the insulator film 16 may be located on the bottom of the groove 11. Since the insulator film 16 is in contact with the substrate 10 on the side surface 10c, it is not necessary to provide the region corresponding to the region 62 of the first comparative example. Thus, the distance L1 between the pads 22 of the adjacent chips 50 becomes, for example, 77 μm.

In the first embodiment, the insulator film 16 is in contact with the side surface 10c of the substrate 10. This structure inhibits water from penetrating into the surface acoustic wave resonator 52 from the boundary face between the insulator film 16 and the side surface 10c of the substrate 10. Furthermore, compared to the case where the groove 11 is not provided as in the first comparative example, the moisture resistance approximately equal to that of the first comparative example is secured even when the chip size is reduced.

First Variation of the First Embodiment

Figure 8A:
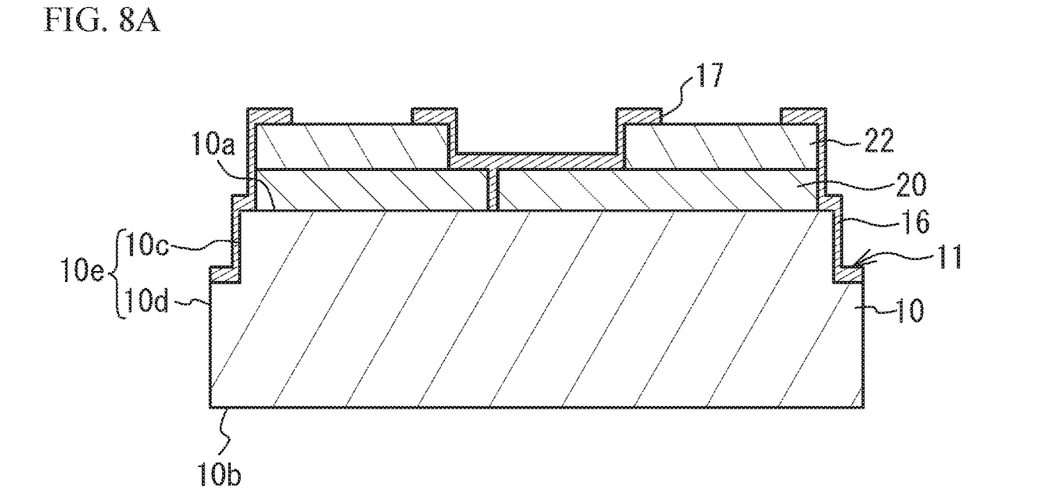
FIG. 8A through FIG. 8C are cross-sectional views of acoustic wave devices in accordance with variations of the first embodiment.

FIG. 8A through FIG. 10C are cross-sectional views of acoustic wave devices in accordance with variations of the first embodiment. As illustrated in FIG. 8A, in a first variation of the first embodiment, the insulator film 16 is provided so as to cover the pads 22, and the apertures 17 are located on the pads 22. As in the first variation, the insulator film 16 may be located on the pad 22. Other structures are the same as those of the first embodiment, and the description thereof is thus omitted.

Second Variation of the First Embodiment

Figure 8B:
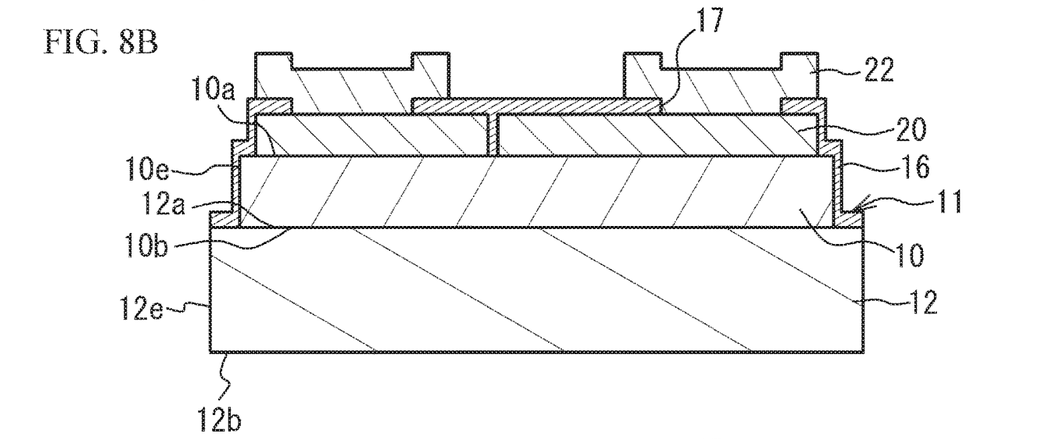

As illustrated in FIG. 8B, in a second variation of the first embodiment, a substrate 12 has an upper surface 12a, a lower surface 12b that is an opposite surface from the upper surface 12a, and a side surface 12e. The lower surface 10b of the substrate 10 is directly bonded to the upper surface 12a of the substrate 12. The substrates 10 and 12 are bonded at room temperature, for example. The substrate 10 has a thickness of, for example, 1 μm to 100 μm. The substrate 12 is, for example, a silicon substrate, a sapphire substrate, an alumina substrate, a spinel substrate, a glass substrate, or a crystal substrate. The substrate 12 has a less linear thermal expansion coefficient in the propagation direction of the surface acoustic wave than the substrate 10. Accordingly, the temperature coefficient of frequency of the surface acoustic wave resonator 52, such as the temperature coefficient of the resonant frequency, can be reduced. Spurious is reduced by making the thickness of the substrate 10 approximately equal to or less than, for example, the wavelength of the surface acoustic wave.

The upper surface 12a of the substrate 12 forms the bottom of the groove 11. The insulator film 16 is in contact with the side surface 10e of the substrate 10, and is not located on the side surface 12e of the substrate 12. Other structures are the same as those of the first embodiment, and the description thereof is thus omitted.

Third Variation of the First Embodiment

Figure 8C:
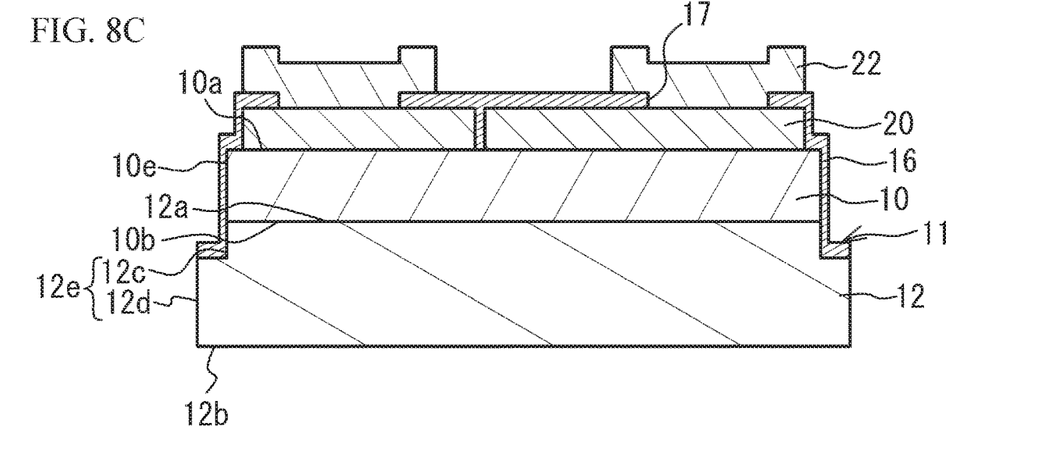

As illustrated in FIG. 8C, in a third variation of the first embodiment, the bottom of the groove 11 reaches a halfway depth of the substrate 12. Thus, the side surface 12e of the substrate 12 has a side surface 12c closer to the upper surface 12a and a side surface 12d closer to the lower surface 12b. The insulator film 16 is in contact with the side surface 10e of the substrate 10 and the side surface 12c of the substrate 12, and is not located on the side surface 12d of the substrate 12. Other structures are the same as those of the second variation of the first embodiment, and the description thereof is thus omitted.

Fourth Variation of the First Embodiment

Figure 9A:
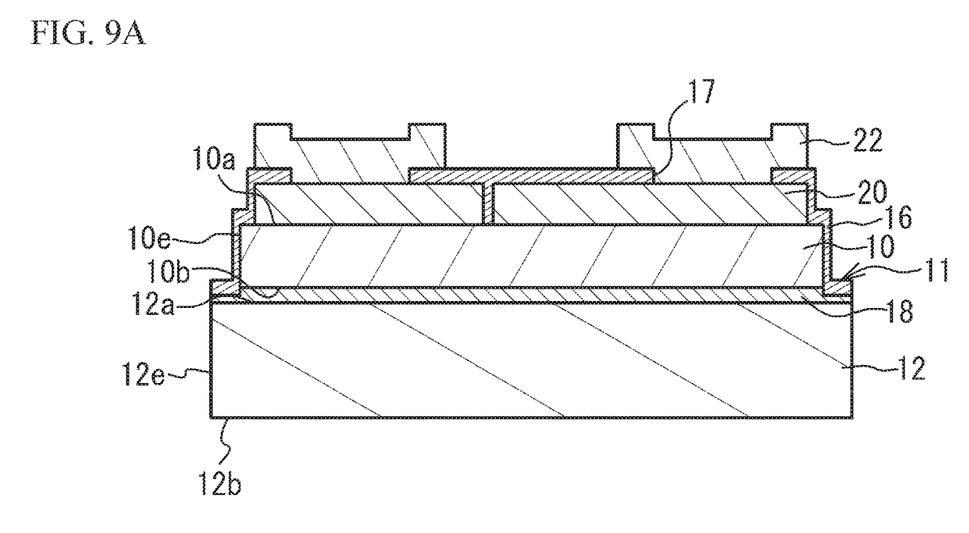
FIG. 9A and FIG. 9B are cross-sectional views of acoustic wave devices in accordance with variations of the first embodiment.

As illustrated in FIG. 9A, in a fourth variation of the first embodiment, an insulator film 18 is located between the substrates 10 and 12. The substrate 10 is in contact with the insulator film 18, and the substrate 12 is in contact with the insulator film 18. The insulator film 18 is a film having high moisture resistance, and is an inorganic insulator film mainly composed of, for example, silicon nitride, silicon oxide, silicon oxynitride, aluminum oxide, or diamond-like carbon. The insulator film 18 has a film thickness of, for example, 10 nm to 100 nm, and has a film thickness of, for example, 50 nm.

The groove 11 reaches a halfway depth of the insulator film 18. At the bottom of the groove 11, the insulator films 16 and 18 are in contact with each other. The insulator film 16 is in contact with the side surface 10e of the substrate 10, and is not located on the side surface 12e of the substrate 12. Other structures are the same as those of the second variation of the first embodiment, and the description thereof is thus omitted.

Fifth Variation of the First Embodiment

Figure 9B:
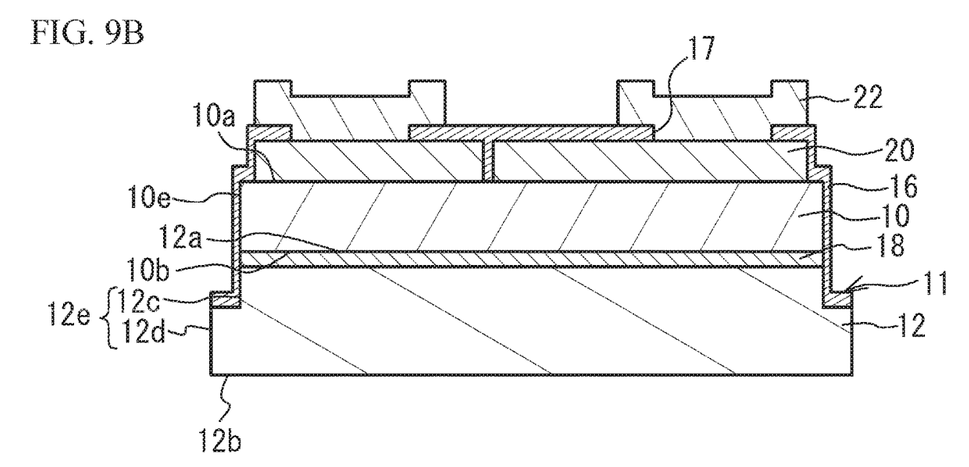

As illustrated in FIG. 9B, in a fifth variation of the first embodiment, the groove 11 penetrates through the insulator film 18 and reaches a halfway depth of the substrate 12. At the bottom of the groove 11, the insulator film 16 is in contact with the substrate 12. The insulator film 16 is in contact with the side surface 10e of the substrate 10, the side surface of the insulator film 18, and the side surface 12c of the substrate 12, and is not located on the side surface 12d of the substrate 12. Other structures are the same as those of the fourth variation of the first embodiment, and the description thereof is thus omitted.

In the fourth and fifth variations of the first embodiment, since the insulator films 16 and 18 cover the substrate 10 and the surface acoustic wave resonator 52, the moisture resistance of the surface acoustic wave resonator 52 is further improved. In addition, the insulator films 16 and 18 are inhibited from being peeled from the substrate 10 when the substrate 12 is cut. In particular, when the insulator films 16 and 18 are made of the same material, the adhesiveness between the insulator films 16 and 18 is high. Accordingly, the moisture resistance of the surface acoustic wave resonator 52 is further improved.

As in the first embodiment and the first through fifth variations thereof, the acoustic wave resonator may be a surface acoustic wave resonator. A dielectric film may be located on the substrate 10 so as to cover the metal film 20. The dielectric film may be thinner than the metal film 20. Alternatively, the dielectric film may be thicker than the metal film 20. When the dielectric film is thicker than the metal film 20, the frequency temperature characteristic can be improved by using a silicon oxide film (to which an element such as fluorine may be added) for the dielectric film.

Sixth Variation of the First Embodiment

Figure 10A:
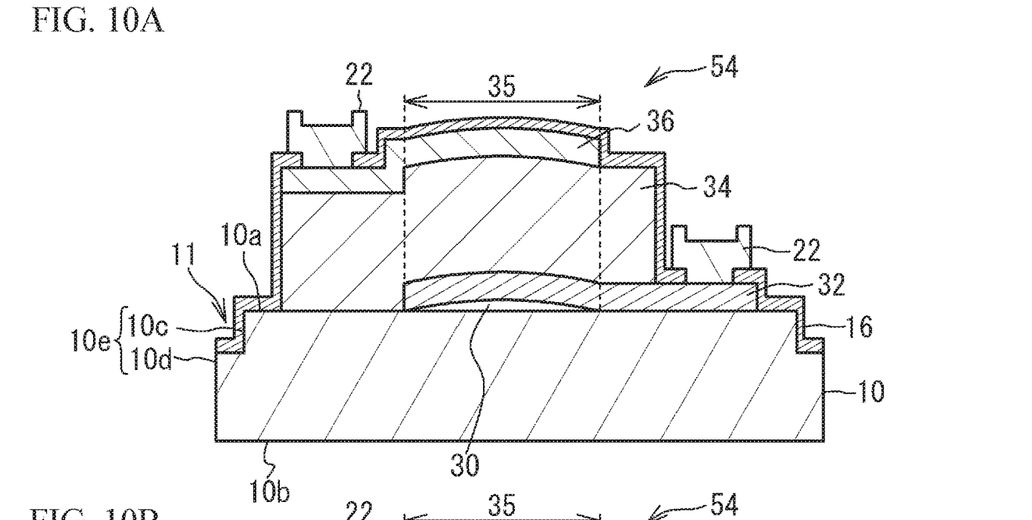
FIG. 10A through FIG. 10C are cross-sectional views of acoustic wave devices in accordance with variations of the first embodiment.

As illustrated in FIG. 10A, in a sixth variation of the first embodiment, a piezoelectric thin film resonator 54 is located on the substrate 10. The piezoelectric thin film resonator 54 includes a lower electrode 32, a piezoelectric film 34, and an upper electrode 36. The lower electrode 32 is located on the substrate 10 through an air gap 30. The piezoelectric film 34 is located on the lower electrode 32. The upper electrode 36 is located on the piezoelectric film 34. The region where the lower electrode 32 and the upper electrode 36 face each other across at least a part of the piezoelectric film 34 is a resonance region 35 in which the acoustic wave resonates. In plan view, the resonance region 35 is included in the air gap 30. The pads 22 are located on the lower electrode 32 and the upper electrode 36.

The substrate 10 is, for example, a silicon substrate, a sapphire substrate, an alumina substrate, a spinel substrate, a glass substrate, or a crystal substrate. The lower electrode 32 and the upper electrode 36 are formed of a single-layer metal film mainly composed of at least one of, for example, Ru, Cr, Al, Ti, Cu, Mo, W, Ta, Pt, rhodium (Rh), and iridium (Ir), or a multilayered metal film of at least two of them. The lower electrode 32 is formed of, for example, a Cr film and a Ru film stacked in this order from the substrate 10 side. The upper electrode 36 is formed of, for example, a Ru film and a Cr film stacked in this order from the piezoelectric film 34 side.

The piezoelectric film 34 is mainly composed of, for example, aluminum nitride (AlN), zinc oxide (ZnO), lead zirconate titanate (PZT), or lead titanate ($PbTiO_3$). When the piezoelectric film 34 is mainly composed of AlN, another element for improving the resonance characteristic or the piezoelectricity may be contained. For example, use of scandium (Sc), a Group II or Group XII element and a Group IV element, a Group II or Group XII element and a Group V element as additive elements improves the piezoelectricity of the piezoelectric film 34. Thus, the effective electromechanical coupling coefficient of the piezoelectric thin film resonator is improved. The Group II element is, for example, calcium (Ca), magnesium (Mg), or strontium (Sr). The Group XII element is, for example, zinc (Zn). The Group IV element is, for example, Ti, zirconium (Zr), or hafnium (Hf). The Group V element is, for example, Ta, niobium (Nb), or vanadium (V). Alternatively, the piezoelectric film 34 may be mainly composed of aluminum nitride, and contain boron (B).

Other structures are the same as those of the first embodiment, and the description thereof is thus omitted.

Seventh Variation of the First Embodiment

Figure 10B:
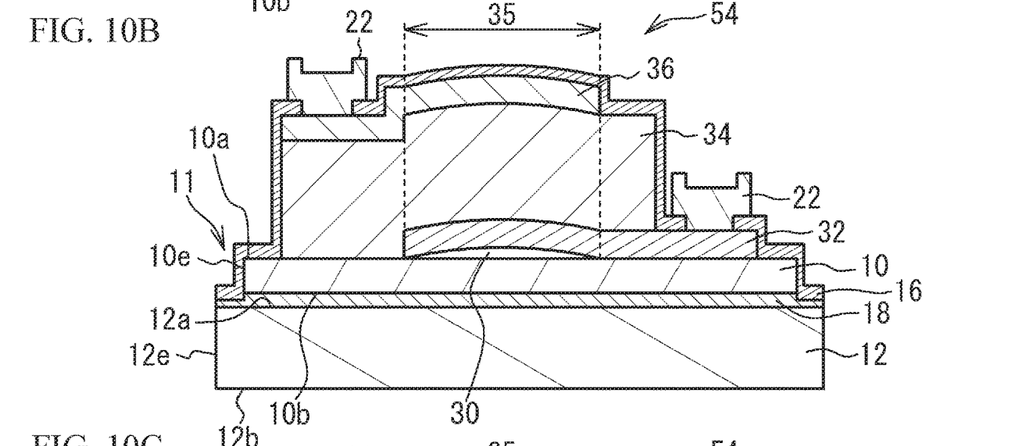

As illustrated in FIG. 10B, in a seventh variation of the first embodiment, the insulator film 18 is located between the substrate 10 and the substrate 12. The substrate 10 is in contact with the insulator film 18, and the substrate 12 is in contact with the insulator film 18. The bottom of the groove 11 reaches a halfway depth of the insulator film 18. The substrate 12 is, for example, a silicon substrate, a sapphire substrate, an alumina substrate, a spinel substrate, a glass substrate, or a crystal substrate. Other structures are the same as those of the fourth and sixth variations of the first embodiment, and the description thereof is thus omitted.

Eighth Variation of the First Embodiment

Figure 10C:
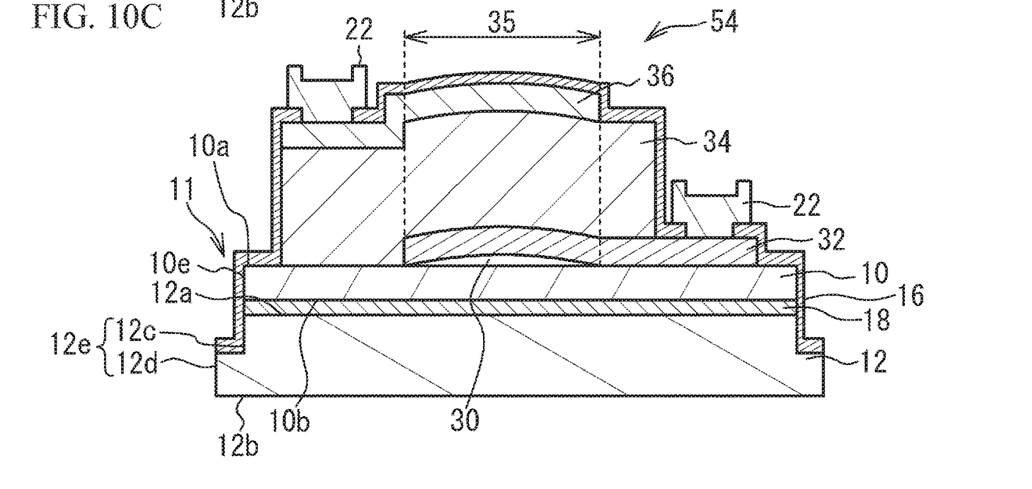

As illustrated in FIG. 10C, in an eighth variation of the first embodiment, the groove 11 reaches a halfway depth of the substrate 12. Other structures are the same as those of the seventh variation of the first embodiment, and the description thereof is thus omitted.

As in the sixth through eighth variations of the first embodiment, the acoustic wave resonator may be a piezoelectric thin film resonator. The air gap 30 may be formed in a recessed portion formed on the upper surface 10a of the substrate 10. Instead of the air gap 30, an acoustic mirror reflecting the acoustic wave in the piezoelectric film 34 may be provided. The planar shape of the resonance region 35 may be, for example, an elliptical shape, a circular shape, or a polygonal shape.

In the second through eighth variations of the first embodiment, as in the first variation of the first embodiment, the insulator film 16 may be located on the pad 22, and the aperture 17 may be located in the insulator film 16.

In the first embodiment and the variations thereof, the insulator film 16 (a first insulator film) covers the acoustic wave resonator such as the surface acoustic wave resonator 52 or the piezoelectric thin film resonator 54, and is in contact with at least the side surface 10c (a part), which is closer to the upper surface 10a (a first surface), of the side surface 10e of the substrate 10 (a first substrate). This structure inhibits water from penetrating into the acoustic wave resonator. Additionally, as described in FIG. 7A and FIG. 7B, the size of the chip 50 can be reduced.

Additionally, in the first embodiment and the first and sixth variations thereof, the side surface 10e of the substrate 10 includes the side surface 10c (a first part) located closer to the upper surface 10a and the side surface 10d (a second part) that is located closer to the lower surface 10b (a second surface) and is located further out than the side surface 10c as viewed from the center of the substrate 10. The insulator film 16 is in contact with the side surface 10c, and is not located on the side surface 10d. This structure inhibits a crack and/or peeling of the insulator film 16, which occurs when the substrate 10 is cut, from reaching the side surface 10c. Thus, penetration of water into the acoustic wave resonator is inhibited.

As in the second through fifth, seventh, and eighth variations of the first embodiment, the substrate 12 (a second substrate) is bonded to the lower surface 10b of the substrate 10. The insulator film 16 is in contact with the side surface 10e of the substrate 10. As described above, the substrate 10 may be located on the upper surface 12a of the substrate 12. The substrate 12 and the substrate 10 may be substrates made of the same material, or substrates made of different materials.

Additionally, at least the side surface 12d (a part), which is located at an opposite side from the substrate 10, of the side surface 12e of the substrate 12 is located further out than the side surface 10e of the substrate 10 as viewed from the center of the substrate 10. The insulator film 16 is not located on the side surface 12d of the substrate 12. This structure inhibits a crack and/or peeling of the insulator film 16, which occurs when the substrate 10 is cut, from reaching the side surface 10c.

As in the fourth, fifth, seventh, and eighth variations of the first embodiment, the insulator film 18 (a second insulator film) is located between the substrates 10 and 12. The insulator films 16 and 18 are in contact with each other. This structure further improves the moisture resistance of the acoustic wave resonator.

The insulator films 16 and 18 are preferably made of the same material. This configuration improves the adhesiveness between the insulator films 16 and 18, and prevents a boundary face from being formed between the insulator films 16 and 18. Thus, penetration of water into parts between the substrate 10 and the insulator films 16 and 18 is further inhibited.

As in the second through fifth variations of the first embodiment, the substrate 10 is a piezoelectric substance substrate, and the acoustic wave resonator includes the surface acoustic wave resonator 52 including the IDT 26 that is located on the upper surface 10a of the substrate 10 and excites the acoustic wave. This structure improves the moisture resistance of the surface acoustic wave resonator 52.

As in the sixth through eighth variations of the first embodiment, the acoustic wave resonator includes the piezoelectric thin film resonator 54 that includes the lower electrode 32 (a first electrode) and the upper electrode 36 (a second electrode), which are located on the upper surface 10a of the substrate 10, and the piezoelectric film 34. This structure improves the moisture resistance of the piezoelectric thin film resonator 54.

The insulator film 16 is an inorganic insulator film. This configuration further improves the moisture resistance of the acoustic wave resonator.

As illustrated in FIG. 2A, an acoustic wave resonator is formed on the upper surface 10a of the substrate 10. As illustrated in FIG. 2B, the groove 11 is formed on the upper surface 10a of the substrate 10 so as to surround the acoustic wave resonator. As illustrated in FIG. 2C, the insulator film 16 is formed so as to cover the acoustic wave resonator and be in contact with the side surface 10c of the groove 11. As illustrated in FIG. 3C, at the bottom of the groove 11, the substrate 10 is cut. Through these processes, the acoustic wave devices of the first embodiment and the variations thereof can be fabricated.

The diagrams of the first embodiment and the variations thereof illustrate an example in which one acoustic wave resonator is located on the upper surface 10a of one substrate 10. However, when a filter is formed on a single substrate 10, a plurality of acoustic wave resonators may be located on the upper surface 10a of a single substrate 10.

Second Embodiment

Figure 11A:
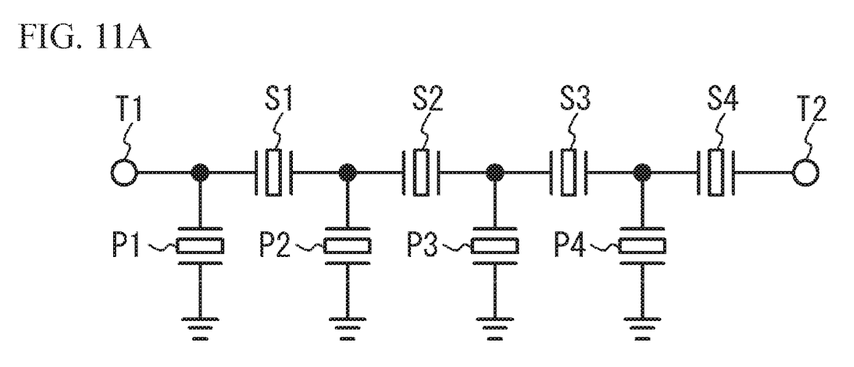
FIG. 11A is a circuit diagram of a filter in accordance with a second embodiment.

A second embodiment is an exemplary filter and an exemplary duplexer including the acoustic wave resonator according to any one of the first embodiment and the variations thereof. FIG. 11A is a circuit diagram of a filter in accordance with the second embodiment. As illustrated in FIG. 11A, one or more series resonators S1 through S4 are connected in series between an input terminal T1 and an output terminal T2. One or more parallel resonators P1 through P4 are connected in parallel between the input terminal T1 and the output terminal T2. The acoustic wave resonator according to any one of the first embodiment and the variations thereof can be used for at least one of the one or more series resonators S1 through S4 and the one or more parallel resonators P1 through P4. All the one or more series resonators S1 through S4 and the one or more parallel resonators P1 through P4 may be located on the upper surface 10a of a single substrate 10. This structure improves the moisture resistance of the filter. The number of resonators in the ladder-type filter can be freely selected. The filter may be a multimode filter.

Figure 11B:
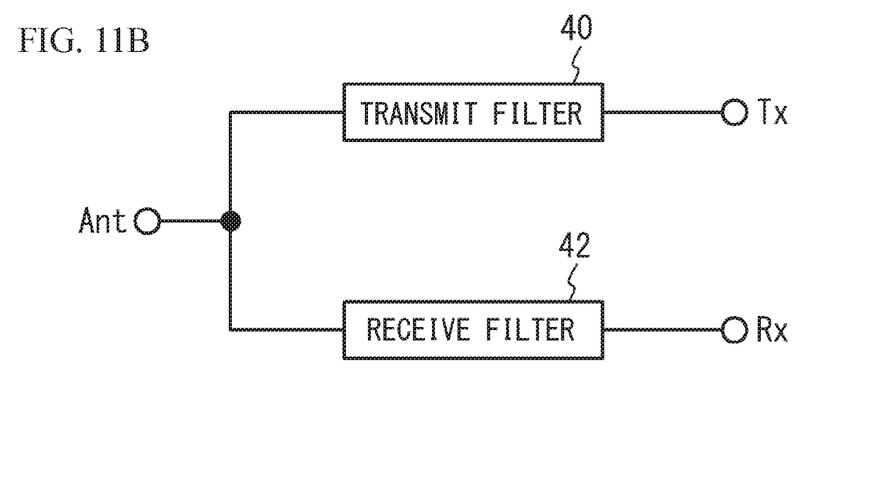
FIG. 11B is a circuit diagram of a duplexer in accordance with a first variation of the second embodiment.

FIG. 11B is a circuit diagram of a duplexer in accordance with a first variation of the second embodiment. As illustrated in FIG. 11B, a transmit filter 40 is connected between a common terminal Ant and a transmit terminal Tx. A receive filter 42 is connected between the common terminal Ant and the receive terminal Rx. The transmit filter 40 transmits signals in the transmit band to the common terminal Ant as transmission signals among high-frequency signals input from the transmit terminal Tx, and suppresses signals with other frequencies. The receive filter 42 transmits signals in the receive band to the receive terminal Rx as reception signals among high-frequency signals input from the common terminal Ant, and suppresses signals with other frequencies. The filter of the second embodiment can be used for at least one of the transmit filter 40 and the receive filter 42.

A duplexer has been described as an example of the multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. An acoustic wave device comprising:
a first substrate having a first surface and a side surface;
an acoustic wave resonator located on the first surface of the first substrate; and
a first insulator film that covers the acoustic wave resonator and is in contact with at least a part, which is located closer to the first surface, of the side surface of the first substrate,
wherein:
the side surface includes a first part, which is located closer to the first surface, and a second part, which is located closer to a second surface and is located further out than the first part as viewed from a center of the first substrate, the second surface being an opposite surface from the first surface,
the first insulator film is in contact with the first part, and is not located on the second part,
the first substrate has a third surface located between the first part and the second part and connected to the first part and the second part,
a normal direction of the first surface interacts a normal direction of the first part and a normal direction of the second part,
a normal direction of the third surface interacts the normal direction of the first part and the normal direction of the second part, and
none of the acoustic wave resonator is exposed to air.

2. The acoustic wave device according to claim 1, wherein the acoustic wave resonator includes a piezoelectric thin film resonator including a first electrode and a second electrode that are located on the first surface of the first substrate, and a piezoelectric film sandwiched between the first electrode and the second electrode.

3. The acoustic wave device according to claim 1, wherein the first insulator film is an inorganic insulator film.

4. A filter comprising:
the acoustic wave device according to claim 1.

5. A multiplexer comprising:
the filter according to claim 4.

6. The acoustic wave device according to claim 1, wherein:
the acoustic wave resonator includes an electrode exciting an acoustic wave, and
a thickness of the first insulator film on the electrode and a thickness of the first film on the at least a part of the side surface of the first substrate are less than a thickness of the electrode.

7. An acoustic wave device comprising:
a first substrate having a first surface and a side surface;
an acoustic wave resonator located on the first surface of the first substrate; and
a first insulator film that covers the acoustic wave resonator and, is in contact with at least a part, which is located closer to the first surface, of the side surface of the first substrate and is mainly composed of silicon nitride, silicon oxynitride, aluminum oxide, or diamond-like carbon,
wherein none of the acoustic wave resonator is exposed to air.

8. The acoustic wave device according to claim 7, wherein the side surface includes a first part, which is located closer to the first surface, and a second part, which is located closer to a second surface and is located further out than the first part as viewed from a center of the first substrate, the second surface being an opposite surface from the first surface, and
the first insulator film is in contact with the first part, and is not located on the second part.

9. The acoustic wave device according to claim 7, further comprising
a second substrate bonded to a second surface that is an opposite surface of the first substrate from the first surface, wherein
the first insulator film is in contact with the side surface of the first substrate.

10. The acoustic wave device according to claim 9, wherein
at least a part, which is located at an opposite side from the first substrate, of a side surface of the second substrate is located further out than the side surface of the first substrate as viewed from a center of the first substrate, and
the first insulator film is not located on the at least the part, which is located at the opposite side from the first substrate, of the side surface of the second substrate.

11. The acoustic wave device according to claim 9, further comprising:
a second insulator film located between the first substrate and the second substrate, wherein
the first insulator film is in contact with the second insulator film.

12. The acoustic wave device according to claim 11, wherein
the first insulator film and the second insulator film are made of a same material.

13. The acoustic wave device according to claim 9, wherein
the first substrate is a piezoelectric substance substrate, and
the acoustic wave resonator includes a surface acoustic wave resonator including an IDT that is located on the first surface of the first substrate and excites an acoustic wave.

14. The acoustic wave device according to claim 7, wherein the acoustic wave resonator includes a piezoelectric thin film resonator including a first electrode and a second electrode that are located on the first surface of the first substrate, and a piezoelectric film sandwiched between the first electrode and the second electrode.

15. The acoustic wave device according to claim 7, wherein:
the acoustic wave resonator includes an electrode exciting an acoustic wave, and
a thickness of the first insulator film on the electrode and a thickness of the first film on the at least a part of the side surface of the first substrate are less than a thickness of the electrode.

16. An acoustic wave device comprising:
a first substrate having a first surface and a side surface;
an acoustic wave resonator located on the first surface of the first substrate;
a first insulator film that covers the acoustic wave resonator and is in contact with at least a part, which is located closer to the first surface, of the side surface of the first substrate;
a second substrate bonded to a second surface that is an opposite surface of the first substrate from the first surface; and
a second insulator film located between the first substrate and the second substrate,
wherein:
the first insulator film is in contact with the side surface of the first substrate,
the first insulator film is in contact with the second insulator film, and
the first insulator film and the second insulator film are made of a same material.

17. The acoustic wave device according to claim 16, wherein the first insulator film is an inorganic insulator film.

18. The acoustic wave device according to claim 16, wherein:
the first substrate is a piezoelectric substance substrate, and
the acoustic wave resonator includes a surface acoustic wave resonator including an IDT that is located on the first surface of the first substrate and excites an acoustic wave.

19. The acoustic wave device according to claim 16, wherein the acoustic wave resonator includes a piezoelectric thin film resonator including a first electrode and a second electrode that are located on the first surface of the first substrate, and a piezoelectric film sandwiched between the first electrode and the second electrode.

* * * * *